United States Patent
Chen

(10) Patent No.: US 7,330,134 B2
(45) Date of Patent: Feb. 12, 2008

(54) KEY CONSTRUCTION METHOD FOR A KEYBOARD AND THE KEYBOARD THEREOF

(75) Inventor: Jason Chen, Taipei (TW)

(73) Assignee: Behavior Tech Computer Corp., Sijhih, Taipei County (TW)

( * ) Notice: Subject to any disclaimer, the term of this patent is extended or adjusted under 35 U.S.C. 154(b) by 0 days.

(21) Appl. No.: 10/703,782

(22) Filed: Nov. 8, 2003

(65) Prior Publication Data

US 2004/0212596 A1 Oct. 28, 2004

(30) Foreign Application Priority Data

Apr. 28, 2003 (TW) .............................. 92109853 A

(51) Int. Cl.
*H03K 17/00* (2006.01)

(52) U.S. Cl. ............................ 341/26; 341/22; 345/168

(58) Field of Classification Search ................ 341/21, 341/22, 23, 26, 176; 345/168, 169
See application file for complete search history.

(56) References Cited

U.S. PATENT DOCUMENTS 6,417,787 B1 * 7/2002 Hsu ............................ 341/26
6,680,676 B1 * 1/2004 Hayashi et al. ............... 341/22

FOREIGN PATENT DOCUMENTS

TW 402123 A1 8/2000

* cited by examiner

*Primary Examiner*—Brian Zimmerman
*Assistant Examiner*—Hung Q Dang
(74) *Attorney, Agent, or Firm*—Thomas, Kayden, Horstemeyer & Risley

(57) ABSTRACT

A key constructing method for a keyboard has M scan lines*N return lines. The electrical interconnects of the M scan lines*N return lines can generate numerical electrical contacts of $A_1$ to $A_{M*N}$, while the numerical electrical contacts of $\{A_1$ to $A_{m*N}\}$ are the electrical contact set $\{A\}$. The key constructing method for the keyboard comprises the following steps: selecting at least one or more electrical contacts from the electrical contact set $\{A\}$ to create an electrical contact set $\{B\}$; creating the electrical contact set $\{C\}$, while the electrical contact set $\{C\}$=the electrical contact set $\{A\}$-the electrical contact set $\{B\}$; combining at least one electrical contact from the electrical contact set $\{C\}$ with one of the electrical contacts from the electrical contact set $\{B\}$ to generate an expanded key.

12 Claims, 3 Drawing Sheets

KEY CONSTRUCTION METHOD FOR A KEYBOARD AND THE KEYBOARD THEREOF

FIELD OF THE INVENTION

The present invention relates to a key constructing method for a keyboard, and more particularly to a method of expanding the number of keys on a keyboard without increasing the number of scan/return lines. The expanded keys generated for a keyboard can be used as hot keys.

BACKGROUND OF THE INVENTION

Taiwanese Patent Application Publication No. 402123"The keyboard device with expandable function keys (Continuation 1)" describes that "a type of keyboard device with expandable function keys (Continuation 1), comprises a keyboard and multiple expandable function keys on the keyboard. The function keys need to be connected to additional Input/Output signal lines of the microprocessor circuit inside the keyboard. These additional Input/Output signal lines are to be combined with the original key matrix of the keyboard to create a new key matrix, which will encode the function keys in such a way that the key codes can be recognized by the Windows application software. A user can use a keyboard to directly control the features of peripheral devices and to know the controlling result from a displaying screen." In order to expand the number of function keys, the prior art needs additional Input/Output lines connected to the microprocessor circuit. The prior art clearly increases the cost of the keyboard.

In order to overcome the disadvantage of the prior art, the inventor of the present invention invents a keyboard and a key constructing method, which completely overcomes the disadvantage of the prior art. The present invention can expand the number of keys on a keyboard without increasing the number of scan/return lines. The expanded keys generated can be used as hot keys.

SUMMARY OF THE INVENTION

The present invention describes a key constructing method for a keyboard. This key constructing method can be used to expand the number of keys on a keyboard without increasing the number of scan/return lines. The expanded keys generated for the keyboard can be used as hot keys.

In order to achieve the goal of the invention, the present invention describes a key constructing method for a keyboard. This key constructing method can be used for a keyboard having M scan lines*N return lines. The M scan lines*N return lines can generate the electrical contacts of $A_1, A_2, A_3, \ldots, A_{M*N}$, while the electrical contacts of $\{A_1, A_2, A_3, \ldots, A_{M*N}\}$ are the electrical contact set $\{A\}$. This key constructing method comprises the following steps: selecting at least one or more electrical contacts from the electrical contact set $\{A\}$ in order to create an electrical contact set $\{B\}$; creating an electrical contact set $\{C\}$, while the electrical contact set $\{C\}$=the electrical contact set $\{A\}$−the electrical contact set $\{B\}$; combining at least one electrical contact from the electrical contact set $\{C\}$ with one of the electrical contacts from the electrical contact set $\{B\}$ to generate an expanded key.

Moreover, in order to achieve the goal of the invention, the present invention describes a type of keyboard, which comprises: M scan lines; N return lines, while M scan lines*N return lines generate the electrical contacts of $A_1, A_2, A_3, \ldots, A_{M*N}$; an expanded key, which comprises two or more electrical contacts of $A_1, A_2, A_3, \ldots, A_{M*N}$.

In addition, in order to achieve the goal of the invention, the present invention describes a key constructing method for a keyboard. This key constructing method is used for a keyboard having M scan lines*N return lines, while M scan lines and N return lines can generate the scan/return lines of $A_1, A_2, A_3, \ldots, A_{M+N}$. The scan/return lines of $\{A_1, A_2, A_3, \ldots, A_{M+N}\}$ are the scan/return line set $\{A\}$. This key constructing method comprises the following steps: selecting at least one or more scan/return lines from the scan/return line set $\{A\}$ to create a scan/return line set $\{B\}$; creating a scan/return line set $\{C\}$, while the scan/return line set $\{C\}$=the scan/return line set $\{A\}$−the scan/return line set $\{B\}$; creating a key matrix circuit based on the scan/return line set $\{C\}$; using the key matrix circuit and one of the scan/return lines from the scan/return line set $\{B\}$ to generate an expanded key.

DETAILED DESCRIPTION OF THE INVENTION

The present invention can expand the number of keys on a keyboard without increasing the number of scan/return lines. In general, the key, generated by using the method described in the present invention, is called the expanded key, which can be used as a hot key in an application.

Figure 1:
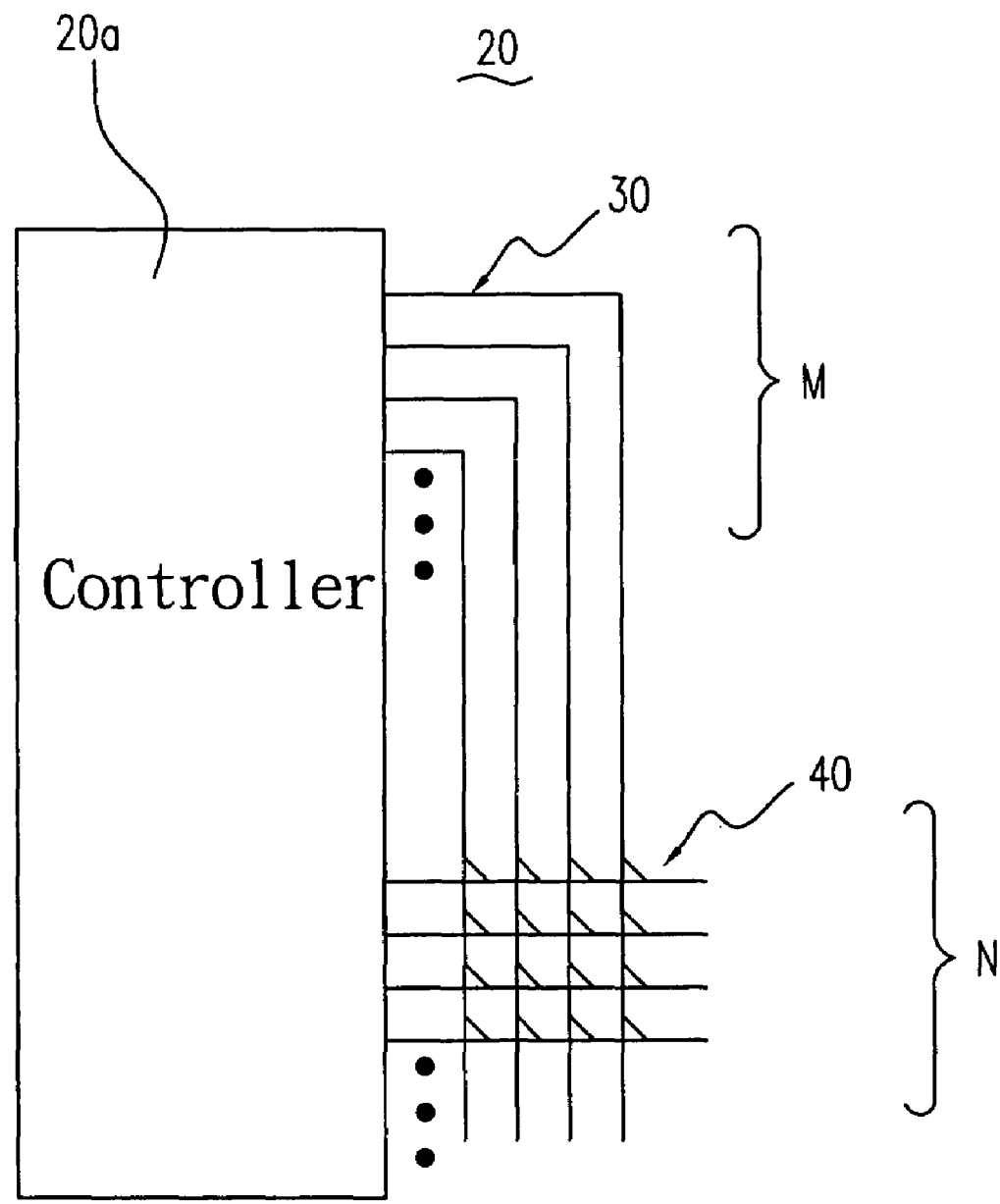
FIG. 1 is a keyboard functional block diagram illustrating the first and the second method of the present invention.

Referring now to FIG. 1, a keyboard functional block diagram is shown to illustrate the first and the second methods of the present invention. The hardware circuitry of the keyboard 20, the controller 20a, comprises M scan lines 30 and N return lines 40. Anyone who is ordinarily skilled in the art understands that M scan lines 30 and N return lines 40 generate M*N electrical contacts of $A_1, A_2, A_3, \ldots, A_{M*N}$, while each electrical contact represents a switch on the hardware circuitry of the keyboard. In the present invention, the M*N electrical contacts of $A_1, A_2, A_3, \ldots, A_{M*N}$ are called the electrical contact set $\{A\}$. The feature of the first method of the present invention is how to arrange the electrical contact set $\{A\}$ in order to generate an expanded key. Similarly, as shown in FIG. 1, controller 20a comprises M scan lines 30 and N return lines 40. Anyone who is ordinarily skilled in the art understands that M scan lines 30 and N return lines 40 generate M+N scan/return lines of $A_1, A_2, A_3, \ldots, A_{M+N}$. Each scan/return line and the other scan/return line intersect with each other, and each intersection point represents a switch on the hardware circuitry of the keyboard. In the present invention, the M+N scan/return lines of $A_1, A_2, A_3, \ldots, A_{M+N}$ are called the scan/return line set $\{A\}$. The feature of the second method of the present invention is how to arrange the scan/return line set $\{A\}$ in order to generate an expanded key.

Figure 2:
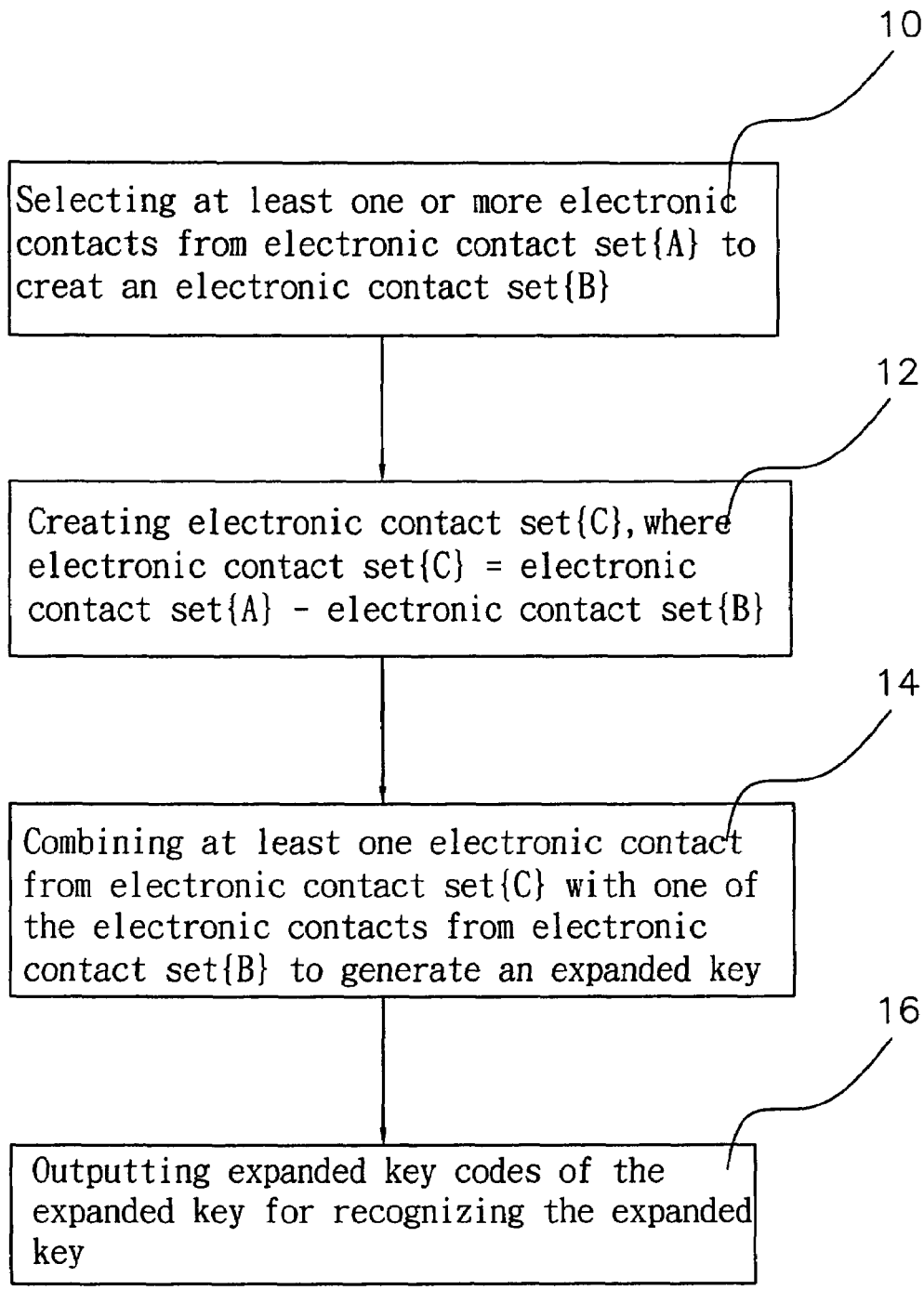
FIG. 2 is a flow chart showing the first method of the present invention.

Referring now to FIG. 2, a flow chart is shown to outline the first method of the present invention.

In step 10, at least one or more electrical contacts are selected from the electrical contact set $\{A\}$ to create an electrical contact set $\{B\}$. Taking a keyboard with 16 scan lines 30*8 return lines 40 for example, that is, in this embodiment, M=16, N=8, 16 scan lines 30*8 return lines 40 can generate 128 electrical contacts of $A_1, A_2, A_3, \ldots, A_{128}$, while the electrical contact set $\{A\}$ is $\{A_1, A_2, A_3, \ldots, A_{128}\}$. An electrical contact $A_1$, for example, is chosen as the electrical contact set $\{B\}$, that is, the electrical contact set $\{B\}$ is $\{A_1\}$. Of course, according to step 10, two or more electrical contacts can be chosen as the electrical contact set $\{B\}$, however, in order to make the present invention easier to understand, only one electrical contact is chosen as the electrical contact set $\{B\}$ in this embodiment.

In step 12, an electrical contact set $\{C\}$ is created. The electrical contact set $\{C\}$=the electrical contact set $\{A\}$–the electrical contact set $\{B\}$, that is, the remainder of the electrical contact set $\{A\}$ minus the electrical contact set $\{B\}$ forms the electrical contact set $\{C\}$. By using the same embodiment as in the previous step, after subtracting $\{A_1\}$ from $\{A_1, A_2, A_3, \ldots, A_{128}\}$, the remainder is $\{A_2, A_3, \ldots, A_{128}\}$, that is, the electrical contact set of $\{C\}$ is equal to $\{A_2, A_3, \ldots, A_{128}\}$.

In step 14, at least one electrical contact from the electrical contact set $\{C\}$ is combined with one of the electrical contacts from the electrical contact set $\{B\}$ to generate an expanded key. By using the same embodiment as above, the electrical contact set $\{C\}$ is $\{A_2, A_3, \ldots, A_{128}\}$, while the electrical contact set $\{B\}$ is $\{A_1\}$. As for the expanding keys, at least the electrical contacts of $\{A_1, A_2\}$ generate an expanded key, the electrical contacts of $\{A_1, A_3\}$ generate an expanded key, the electrical contacts of $\{A_1, A_4\}$ generate an expanded key, the electrical contacts of $\{A_1, A_5\}$ generate an expanded key, the electrical contacts of $\{A_1, A_6\}$ generate an expanded key, . . . , the electrical contacts of $\{A_1, A_{128}\}$ generate an expanded key, 127 expanded keys can be generated totally.

From step 10 to step 14, one can understand that the number of keys on keyboard 20 can be very easily expanded without increasing the number of scan lines 30 and return lines 40. As for the number of expanded keys based on the same embodiment, when the electrical contact set $\{B\}$ is $\{A_1\}$, 127 expanded keys can be generated. The generated 127 expanded keys plus the 127 original keys generated from the electrical contacts of $\{A_2, A_3, \ldots, A_{128}\}$, at least 254 keys can be generated by 8*16 scan lines 30 and return lines 40. As a result, the number of keys on the keyboard is far beyond the 128 keys based on the ordinary skill in the art.

The detailed explanation for the embodiment of the electrical contact set $\{B\}$ being $\{A_1, A_2\}$ is described in order to understand the embodiment of the electrical contact set $\{B\}$ being one electrical contact of $\{A_1\}$, the embodiment of the electrical contact set $\{B\}$ being two electrical contacts of $\{A_1, A_2\}$, and the embodiment of the electrical contact set $\{B\}$ being three or more electrical contacts. When the electrical contact set $\{B\}$ is $\{A_1, A_2\}$, for the embodiment of generated expanded keys, the electrical contact set $\{C\}$ is the expanded keys of $\{A_3, \ldots, A_{128}\}$, at least the expanded key of the electrical contacts of $\{A_1, A_3\}$, the expanded key of the electrical contacts of $\{A_1, A_4\}$, the expanded key of the electrical contacts of $\{A_1, A_5\}$, the expanded key of the electrical contacts of $\{A_1, A_6\}$, the expanded key of the electrical contacts of $\{A_1, A_7\}, \ldots$, the expanded key of the electrical contacts of $\{A_1, A_{128}\}$, and etc. In addition, the electrical contact set $\{C\}$ is the expanded key of the electrical contacts of $\{A_2, A_3\}$, the expanded key of the electrical contacts of $\{A_2, A_4\}$, the expanded key of the electrical contacts of $\{A_2, A_5\}$, the expanded key of the electrical contacts of $\{A_2, A_6\}$, the expanded key of the electrical contacts of $\{A_2, A_7\}, \ldots$, the expanded key of the electrical contacts of $\{A_2, A_{128}\}$, and etc. Totally, 252 (126*2) expanded keys can be generated. These 252 expanded keys plus 126 original keys generated from the electrical contacts of $\{A_3, \ldots, A_{128}\}$, at least 378 keys can be generated from the 8*16 scan lines 30 and return lines 40, which is far beyond the 128 keys as one knows from the ordinary skill in the art.

In step 16, based on the expanded keys generated by all the electrical contacts, after the expanded keys are pressed, the keyboard 20 outputs multiple key codes, some of which are used to recognize the expanded keys. Step 16 is described by using the same embodiment as above, that is, the expanded key generated by the electrical contacts of $\{A_1, A_2\}$. The number of electrical contacts of the expanded key generated by the electrical contacts of $\{A_1, A_2\}$ is two, and keyboard 20 outputs multiple key codes, some of which can be used to recognize the expanded key, that is, after the expanded key generated by the electrical contacts of $\{A_1, A_2\}$ is pressed, keyboard 20 outputs multiple key codes, the key code receiver, for example, the computer, can use the multiple key codes to recognize this expanded key. The implementation of the multiple key codes is designating the first key code to be a special code. For example, the corresponding special code for the first key code of the expanded key generated by equating the electrical contact set $\{B\}$ to the electrical contact of $\{A_1\}$ is E0, and the corresponding special code for the first key code of the expanded key generated by equating the electrical contact set $\{B\}$ to the electrical contact of $\{A_2\}$ is E1. Accordingly, the second key code is a normal key code.

Based on the present invention, keyboard 20 comprises: M scan lines 30 and N return lines 40, while M scan lines 30 and N return lines 40 generate electrical contacts of $A_1, A_2, A_3, \ldots, A_{M*N}$. The expanded keys comprises two or more electrical contacts of $A_1, A_2, A_3, \ldots, A_{M*N}$. In the present invention, keyboard 20 further comprises multiple key codes, which is used to recognize expanded keys. In addition, the first key code of the multiple key codes of keyboard 20 is a special code.

Figure 3:
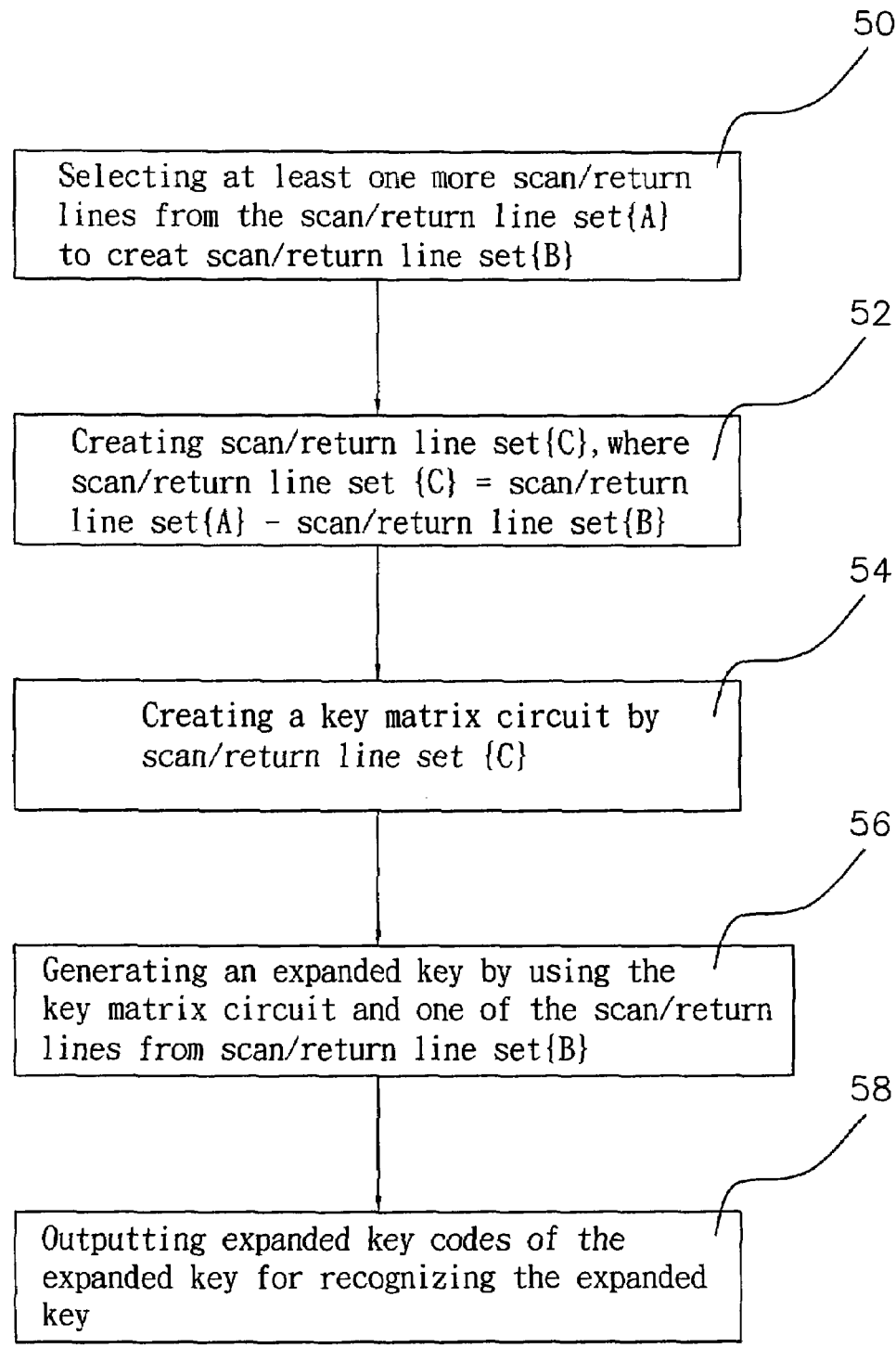
FIG. 3 is a flow chart showing the second method of the present invention.

Referring now to FIG. 3, a flow chart of the second method of the present invention is shown. Similarly, the second method of the present invention can be used for a keyboard 20 with M scan lines 30 and N return lines 40, while M scan lines 30 and N return lines 40 can generate the scan/return lines of $A_1, A_2, A_3, \ldots, A_{M+N}$. In the present invention, the scan/return lines of $\{A_1, A_2, A_3, \ldots, A_{M+N}\}$ is the scan/return line set $\{A\}$.

In step 50, at least one or more scan/return lines are selected from the scan/return line set $\{A\}$ in order to generate a scan/return line set $\{B\}$. Taking a keyboard with 8 scan lines 30*16 return lines 40 as an example, that is, M=8, N=16 in this embodiment, the 8 scan lines 30*16 return lines 40 can generate 24 scan/return lines of $A_1, A_2, A_3, \ldots, A_{24}$, while the scan/return line set $\{A\}$ is $\{A_1, A_2, A_3, \ldots, A_{24}\}$. In this embodiment, one scan/return line $A_1$ is selected to be the scan/return line set $\{B\}$, that is, the electrical contact set $\{B\}$ is equal to $\{A_1\}$. According to the present invention, two or more scan/return lines can be used for the scan/return line set $\{B\}$, however, in order to simplify the embodiment and to make the present invention easier to understand, only one scan/return line is selected to be the scan/return line set $\{B\}$.

In step 52, the scan/return line set $\{C\}$ is created. The scan/return line set $\{C\}$=the scan/return line set of $\{A\}$–the scan/return line set $\{B\}$. By using the same embodiment as above, the remainder of $\{A_1, A_2, A_3, \ldots, A_{24}\}$ subtracting $\{A_1\}$ is $\{A_2, A_3, \ldots, A_{24}\}$, that is, the scan/return line set $\{C\}$ is equal to $\{A_2, A_3, \ldots, A_{24}\}$.

In step 54, a key matrix circuit is created from the scan/return line set $\{C\}$.

In step 56, an expanded key is generated by combining the key matrix circuit with one of the scan/return lines from the scan/return line set $\{B\}$.

In step 54 and 56, the scan/return line set $\{C\}$ is $\{A_2, A_3, \ldots, A_{24}\}$, while the scan/return line set $\{B\}$ is $\{A_1\}$. According to step 54, a key matrix circuit is created from the scan lines 30 and the return lines 40 of the scan/return line set $\{C\}$, and all the keys of this key matrix circuit are normal keys with single electrical contact. According to step 56, part or all of the key matrix circuit will be duplicated. A key of two electrical contacts are generated by combining one of the scan lines 30 or return lines 40 from the originally created key matrix circuit with one of the scan/return lines from the scan/return line set $\{B\}$ in the direction of row or column. This newly generated key with two electrical contacts is the expanded key of the present invention.

In step 58, based on the expanded keys generated by all the electrical contacts, after the expanded keys are pressed, keyboard 20 outputs multiple keyboard codes, some of which are used for recognizing the expanded keys. Since step 58 is similar with step 16, step 58 will not be repeated here.

Keyboard 20, made by using the first and the second method of the present invention, can be used as a computer keyboard, or the key input device for portable electronic devices, such as notebook computers, personal data assistance devices, mobile phone, and etc.

Anyone who is ordinarily skilled in the art should understand that many modifications and variations are possible in light of the above teaching for the present invention. The scope of the invention is intended to be defined by the claims appended hereto and their equivalents.

What is claimed is:

1. A key constructing method for a keyboard having M scan lines and N return lines, wherein M scan lines*N return lines generate electrical contacts of $A_1, A_2, A_3, \ldots, A_{M*N}$, and said electrical contacts of $\{A_1, A_2, A_3, \ldots, A_{M*N}\}$ is an electrical contact set $\{A\}$, comprising the steps of: selecting at least one or more electrical contacts from said electrical contact set $\{A\}$ in order to create an electrical contact set $\{B\}$; creating an electrical contact set $\{C\}$, wherein said electrical contact set $\{C\}$=said electrical contact set $\{A\}$−said electrical contact set $\{B\}$; combing at least one electrical contact from said electrical contact set $\{C\}$ with one of the electrical contacts from said electrical contact set $\{B\}$ to generate an expanded key.

2. The method of claim 1, comprising the further step of: based on all of the electrical contacts of said expanded key, after said expanded key is pressed, outputting multiple key codes by said keyboard, wherein said multiple key codes are used to recognize said expanded key.

3. The method of claim 2, wherein the first key code of said multiple key codes is a special code.

4. The method of claim 2, wherein said multiple key codes are two key codes.

5. A keyboard made by said method of claim 1.

6. A keyboard made by said method of claim 2.

7. A key constructing method for a keyboard having M scan lines and N return lines, wherein M scan lines and N return lines can generate scan/return lines of $A_1, A_2, A_3, \ldots, A_{M+N}$, and said scan/return lines of $\{A_1, A_2, A_3, \ldots, A_{M+N}\}$ are a scan/return line set $\{A\}$, comprising the steps of: selecting at least one or more scan/return lines from said scan/return line set $\{A\}$ to create a scan/return line set $\{B\}$; creating a scan/return line set $\{C\}$, wherein said scan/return line set $\{C\}$=said scan/return line set $\{A\}$-said scan/return line set $\{B\}$; creating a key matrix circuit by said scan/return line set $\{C\}$; generating an expanded key by using said key matrix circuit and one of the scan/return lines from said scan/return line set $\{B\}$.

8. The method of claim 7, comprising further the step of: based on all of the electrical contacts of said expanded key, after said expanded key is pressed, outputting multiple key codes by said keyboard, wherein said multiple key codes are used to recognize said expanded key.

9. The method of claim 8, wherein the first key code of said multiple key codes is a special code.

10. The method of claim 8, wherein said multiple key codes are two key codes.

11. A keyboard made by said method of claim 7.

12. A keyboard made by said method of claim 8.

* * * * *